(12) United States Patent
Shibata et al.

(10) Patent No.: US 7,046,043 B2
(45) Date of Patent: May 16, 2006

(54) CURRENT-VOLTAGE CONVERTER CIRCUIT AND ITS CONTROL METHOD

(75) Inventors: Kenji Shibata, Kasugai (JP); Satoru Kawamoto, Kasugai (JP)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 11/061,119

(22) Filed: Feb. 18, 2005

(65) Prior Publication Data

US 2005/0184767 A1    Aug. 25, 2005

Related U.S. Application Data

(63) Continuation of application No. PCT/JP2004/001938, filed on Feb. 19, 2004.

(51) Int. Cl.
*G01R 19/00* (2006.01)
(52) U.S. Cl. .................................. 327/51; 327/103
(58) Field of Classification Search ............ 327/51, 327/52, 56, 103, 382, 404
See application file for complete search history.

(56) References Cited

U.S. PATENT DOCUMENTS

| 5,528,544 | A |   | 6/1996  | Kohno |
|-----------|---|---|---------|-------|
| 5,687,126 | A |   | 11/1997 | Hirano et al. |
| 5,856,748 | A | * | 1/1999  | Seo et al. ............. 327/53 |
| 6,088,277 | A |   | 7/2000  | Kim et al. |
| 6,370,072 | B1| * | 4/2002  | Dennard et al. ......... 365/210 |
| 6,490,199 | B1|   | 12/2002 | Lee et al. |
| 6,504,761 | B1|   | 1/2003  | Kai et al. |
| 6,795,346 | B1|   | 9/2004  | Otani et al. |
| 6,859,380 | B1| * | 2/2005  | Ashikaga ............... 365/145 |
| 2002/0105831 | A1 | | 8/2002 | Lee et al. |

FOREIGN PATENT DOCUMENTS

| JP | 05-174594   | 7/1993 |
| JP | 2504410 B2  | 4/1996 |
| JP | 11-149790   | 2/1999 |
| JP | 2002-237193 | 8/2002 |

\* cited by examiner

*Primary Examiner*—Jeffrey Zweizig
(74) *Attorney, Agent, or Firm*—Ingrassia Fisher & Lorenz PC

(57) ABSTRACT

An input current flowing into a current-voltage conversion circuit (1) is converted to a voltage value at an output terminal SAIN and, then, a differential amplification circuit (5) amplifies and outputs a differential voltage between the voltage value and the reference voltage Vref. PMOS and NMOS transistors T1, T2 are connected between the output terminal SAIN and the power-supply voltage VCC. After the output terminal SAIN is precharged to the power-supply voltage VCC by making the transistors conductive, the current-voltage conversion operation is performed by making a voltage drop corresponding to the input current. The precharge operation precharges the output terminal SAIN up to the power-supply voltage VCC and supplies precharge to a common data line N3 and bit lines.

12 Claims, 4 Drawing Sheets

CURRENT-VOLTAGE CONVERTER CIRCUIT AND ITS CONTROL METHOD

CROSS-REFERENCES TO RELATED APPLICATIONS

This is a continuation of International Application No. PCT/JP2004/001938, filed Feb. 19, 2004 which was not published in English under PCT Article 21(2).

FIELD OF THE INVENTION

The present invention relates to current-voltage conversion to convert the presence and absence of an input current to different voltage levels. More particularly, the invention relates to the current-voltage conversion that converts stored information, which is obtained from a memory as the presence or absence of a current, to a voltage value and detects its binary state.

BACKGROUND OF THE INVENTION

In a current sense amplifier circuit disclosed in Japanese unexamined patent application publication No. H11(1999)-149790, as is shown in FIG. 4, stored information is read as a current value from bit lines BL (0) to BL (n) of a semiconductor memory section 100 via column select transistors T8, T9, and a common data line N3 coupled to a current sense amplifier circuit 200.

In the current sense amplifier circuit 200, the current for the data read from the memory on the common data line N3 is supplied to the source of an n-channel transistor T300, amplified by the transistor T300 and a p-channel transistor T400 connected to a power supply, and output via a node 400 to an n-channel transistor T600. The transistor T600 forms an amplification circuit with a p-channel transistor T700 and the amplification circuit converts the data from the memory that was input as the current value to a voltage value and outputs the voltage as an output from the current sense amplifier circuit 200.

Prior to the current-voltage conversion operation, the node 400 and the common data line N3 are precharged and the bit lines connected by the column select transistors are precharged through the common data line N3. The precharge operation is performed by making the p-channel transistor T400 and the p-channel transistor T500 conductive. The transistor T400 is conductive during a complete period of the current-voltage conversion operation and the precharge operation and the transistor T500 mainly carries out the precharge operation for a short period prior to the current-voltage conversion operation.

In a non-volatile semiconductor memory device disclosed in Japanese Patent Application Laid-Open No. 2002-237193, a similar sense amplifier is also disclosed. A PMOS transistor is used as the transistor that carries out the precharge operation.

However, in the above background art, the p-channel transistor or PMOS transistor is used as the transistor for precharge and precharges the node in the current sense amplifier circuit while, at the same time, precharging the common data line and the bit lines. As the capacity of non-volatile semiconductor memory devices expands, the wiring length of the common data line increases and a greater number of memory cells are connected to the bit lines. With much more wiring capacitances, the sense amplifier is required to perform high-speed precharge operations in advance of performing high-speed current-voltage conversion operation. The sense amplifier circuit needs to be equipped with the p-channel transistor or PMOS transistor having a sufficient current supply capability and the transistor size must be larger. This poses a problem in that higher integration is required for non-volatile semiconductor memory devices together at the same time as capacity expansion is desired for non-volatile semiconductor memory devices.

A large transistor has large parasitic capacitances induced by a gate oxide layer between its gate and drain and induced by the PN junction between the drain and the substrate and these parasitic capacitances are added to the node in the current sense amplifier circuit. In the current-voltage conversion operation following the completion of the precharge operation, these parasitic capacitances give rise to a problem, as they cause a delay in potential charge at the internal node in response to current for data from the memory, input to the current sense amplifier circuit, which might result in deterioration in the speed or sensitivity of current sensing. Also, through these parasitic capacitances, capacitance coupling may take upon a level transition of a bias voltage to the gate terminal, which might cause a fluctuation of the level of the voltage at the internal node. This poses a problem whereby the level fluctuation of the voltage to which the input current will be converted might cause a conversion error.

Here, in order to avoid the above problems, it is conceivable to configure the sense amplifier circuit with an NMOS transistor of the same size with a high current drivability instead of the PMOS transistor as the transistor for precharge.

However, when the node connected to the drain terminal of the NMOS transistor in which a power-supply voltage is applied to its gate terminal is precharged to a high potential level, it is precharged to the level of the power-supply voltage less a threshold voltage. In view of extensive applications of low power-supply voltage expected in future non-volatile semiconductor memory devices, when the voltage level to be increased by the precharge operation is high, but so limited, it narrows the voltage range in which the circuit operates and this poses a problem in which it might be hard to ensure operating within predetermined margins.

Information stored in a memory cell is read and its state is determined by presence or absence of a current. When the data read from the memory cell corresponds to no current flow, the internal node in the current-voltage conversion circuit remains at the precharged voltage level; when the data corresponds to a current flow, the precharged voltage level is stepped down. Thus, upon the end of the precharge operation, a transition of the gate voltage of the NMOS transistor to a low level takes place to make the transistor non-conductive and, in consequence, it can be supposed that the precharged voltage level falls by capacitance coupling through the parasitic capacitances. Since the voltage level precharged with the NMOS transistor is equal to the power-supply voltage less the threshold voltage, this level will be stepped down to a still lower voltage level, when affected by the capacitance coupling. This poses the following problem. In instances where the sense amplifier circuit is configured such that this voltage is compared with a reference voltage and differential amplification is performed to ensure reading of data from the memory, a data read error might occur.

The present invention has been made to solve at least one problem with the above prior art and aims to provide a current-voltage conversion circuit and its control method that can achieve both enhancing the speed or sensitivity of current sensing and precharging at a higher speed together in compact circuitry, while preventing a conversion error in the process of current-voltage conversion, and that can function well with a low power-supply voltage.

BRIEF DESCRIPTION OF DRAWINGS

The present invention will hereinafter be described in conjunction with the following drawing figures, wherein like numerals denote like elements.

DETAILED DESCRIPTION OF THE INVENTION

The following detailed description of the invention is merely exemplary in nature and is not intended to limit the invention or the application and uses of the invention. Furthermore, there is no intention to be bound by any theory presented in the preceding background of the invention or the following detailed description of the invention.

A concrete embodiment of a current-voltage conversion circuit and a non-volatile semiconductor memory device of the present invention will be described hereinafter with reference to FIGS. 1 to 3.

Figure 1:
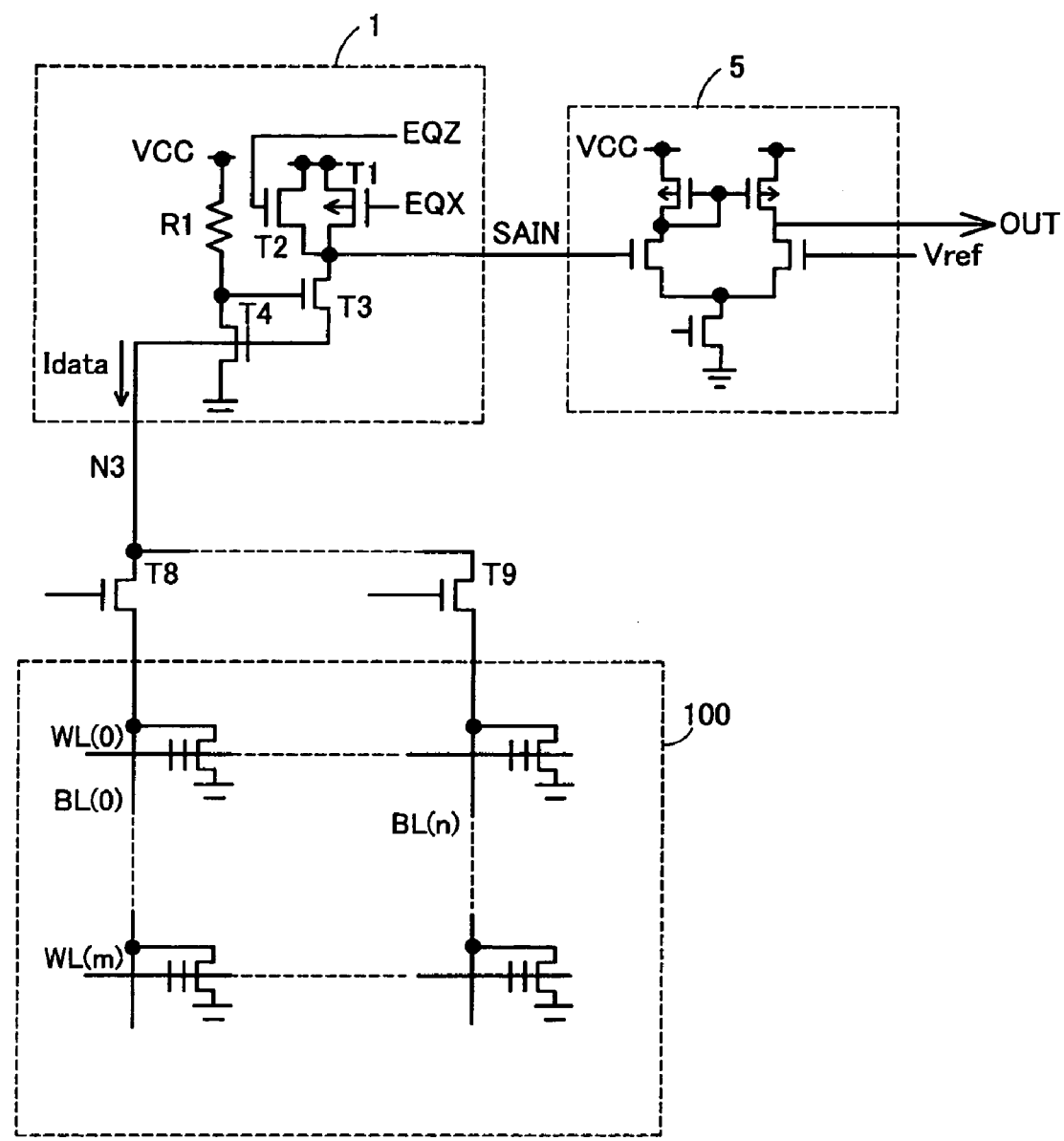
FIG. 1 is a circuit diagram showing an embodiment of the present invention.

In the embodiment shown in FIG. 1, stored information is read as a current value from bit lines BL (0) to BL (n) of a semiconductor memory section 100 via column select transistors T8, T9, and a common data line N3 and the current value is input to a current-voltage conversion circuit 1. After the current value is converted to a voltage value, a differential amplification circuit 5 amplifies a differential voltage between the voltage value and a reference voltage Vref and outputs the differential voltage as data OUT from the memory.

The common data line N3 is connected to the source terminal of an NMOS transistor T3 and the gate terminal of an NMOS transistor T4. The source terminal of the transistor T4 is connected to a ground potential and its drain terminal is connected to a power-supply voltage VCC via a resistor element R1 and to the gate terminal of the transistor T3. The voltage at the drain terminal of the transistor T3 as an output SAIN of the current-voltage conversion circuit 1 is input to the differential amplification circuit 5 in the following stage and a differential voltage between that voltage and the reference voltage Vref is amplified. Between the output terminal SAIN and the power-supply voltage VCC of the current-voltage conversion circuit 1, a PMOS transistor T1 and an NMOS transistor T2 are connected and a precharge signal EQX and a precharge signal EQZ of opposite phases are respectively input to the gate terminals of these transistors. The precharge signal EQX is a low level signal and the precharge signal EQZ is a high level signal and these signals respectively trigger precharging; that is, making the transistors T1 and T2 conductive during the initialization operation.

Reading of stored information from the semiconductor memory section 100 is performed through a current path that is formed as follows: select a memory cell by selecting one of word lines WL (0) to WL (m) and connect one of the bit lines BL (0) to BL (n) to the common data line N3 by selecting one of the column select transistors T8 and T9. The transistor of the memory cell selected by selecting a word line may be conductive or non-conductive, which is determined, subject to the binary state of the data stored in the cell. Presence or absence of data current Idata flowing along the path from the transistor T3 to the memory cell is determined, depending on whether or not the path is connected to the ground potential; thereby, reading the data from the memory. The data current Idata flows from the transistor T3 toward the memory cell.

As a typical example of the semiconductor memory section 100 is a flash memory or the like. For stored information, one bit data is stored into a memory cell with one of two different threshold voltages of a cell transistor that forms the memory cell. One of two value states, conductive and non-conductive, is read, according to the selection of a word line. One state where the cell transistor is at a deep (high) threshold voltage and the data current Idata does not flow is termed a programmed state (PGM) and indicates data "0." The other state where the cell transistor is at a shallow threshold voltage and the data current Idata flows is termed an erased state (ERSE) and indicates data "1."

The data current Idata read from the semiconductor memory section 100 is transmitted via the transistor T3 to the output terminal SAIN. The output terminal SAIN needs to be precharged to the power-supply voltage VCC prior to the current-voltage conversion operation in which the data current Idata is converted to a voltage value. With the voltage level of the output terminal SAIN precharged to the power-supply voltage VCC, a voltage drop may or may not occur, subject to whether or not the data current Idata is present and conversion to a voltage value is performed.

A circuit that carries out precharging the output terminal SAIN consists of the transistors T1 and T2 connected in parallel between the power-supply voltage node and the output terminal SAIN. In the precharge operation, by making these transistors conductive, the voltage level of the output terminal SAIN is precharged to the power-supply voltage VCC.

The precharge operation which makes the transistors T1 and T2 conductive charges the output terminal SAIN up to the power-supply voltage VCC and supplies charges via the transistor T3 to the common data line N3 and via the column select transistors to the bit lines, thus precharging them.

The transistor T4 in conjunction with the resistor element R1 determines the gate voltage of the transistor T3. Thus, since the gate terminal of the transistor T4 is connected to the common data line N3, the conductance of the transistor T4 increases in proportion to an increase in the voltage on the common data line N3 and the transistor T4 acts to decrease the gate voltage of transistor T3 in order to suppress a further increase in the voltage on the common data line N3. Thereby, this action maintains the precharged voltage level of the common data line N3 and the bit lines at a predetermined low voltage level.

As for the non-volatile semiconductor memory device, as typified by a flash memory or the like, there is a type in which, according to a voltage bias that is applied to a bit line and the drain and well terminals of a cell transistor, data is stored by charging or discharging a floating gate in the cell transistor. In an instance where cell transistors of this type are connected to the bit lines, an excessively high level of the precharged voltage of the bit lines might result in a so-called disturbance phenomenon in which electrons programmed on the floating gate are discharged. Therefore, the precharged voltage level of the common data line N3 and the bit lines is required to be maintained at a predetermined low voltage level which the present invention advantageously acheives.

Figure 2:
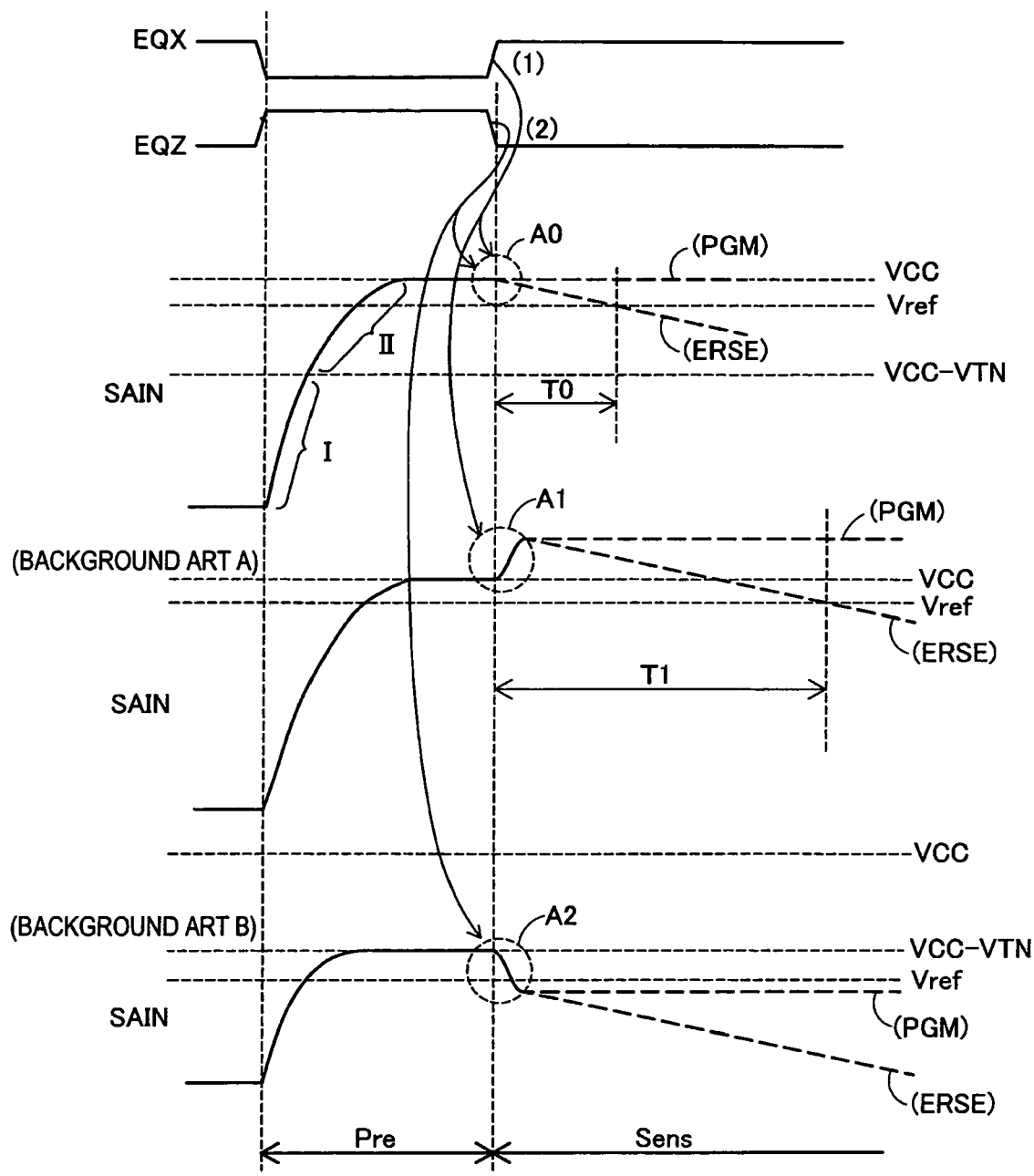
FIG. 2 shows operating waveform charts to explain a first control method in the embodiment of FIG. 1.

Operating waveforms to explain a first control method for converting data current Idata read from the semiconductor memory section 100 to a voltage value and amplifying the voltage by the differential amplification circuit 5 are shown in FIG. 2. In FIG. 2, such operating waveforms according to a background art in which a precharging transistor structure consists only of a PMOS transistor (Background Art A in FIG. 2) and such operating waveforms according to a background art in which the precharging transistor structure consists only of an NMOS transistor (Background Art B in FIG. 2) are also shown for convenience of comparison to the present invention. Each structure is assumed to have the same current drivability for precharge. Although not shown, the common data line and the bit line together with the output terminal SAIN are also precharged to a predetermined voltage level during a precharge period Pre.

Reading of stored information comprises an amplification period Sens of amplifying a voltage to which a data current from the memory was converted and the precharge period Pre that precedes the amplification period Sens. In the first control method, during the precharge period Pre, the precharge signal EQX for the PMOS transistor T1 changes to a low level and the precharge signal EQZ for the NMOS transistor T2 changes to a high level. Thus, the transistors T1 and T2 are controlled to become conductive at virtually the same time. Here, the wording "virtually the same time" means the same time including a time difference by a delay for a logical inversion circuit or the like to generate one signal from the other signal with the phase inverted, as the precharge signals EQX and EQZ are logical signals of opposite phases to control the conduction.

As the precharge operation begins, both transistors T1 and T2 begin to become conductive and the voltage level of the output terminal SAIN increases over time. As the voltage level of the output terminal SAIN increases, the NMOS transistor T2 switches from triode operation to pentode operation and its current drivability gradually decreases. The transistor T2 can charge the output terminal SAIN up to a voltage level VCC of the power-supply voltage less the threshold voltage of the NMOS transistor. During a period (I) from the start of the precharge until the voltage level has reached the VCC–VTN, both the transistors T1 and T2 connected in parallel are conductive and carry out the precharge operation.

During a period (II) when the voltage level of the output terminal SAIN exceeds VCC–VTN and rises up to the power-supply voltage VCC, only the transistor T1 is conductive. Because, normally the precharged voltage level of the common data line N3 and the bit lines is sufficiently lower than the voltage level of VCC–VTN, the node to be charged during the period (II) is the output terminal SAIN exclusively.

As the capacity of non-volatile semiconductor memory devices expand, the wiring length of the common data line and the bit lines increases and/or a great number of memory cells are connected to the bit lines. In consequence, great wiring capacitances may be added to the common data line and the bit lines and it is needed to ensure a sufficient current drivability during the period (I).

During the period (I), it is required to ensure the current drivability to charge the current path having great wiring capacitances from the output terminal SAIN through the common data line up to the bit lines all together. During the period (II), a function to charge the output terminal SAIN up to the voltage level of the power-supply voltage VCC is required.

Here, since the precharged voltage level of the common data line and the bit lines is sufficiently lower than the voltage level of VCC–VTN, charging can be performed, using the NMOS transistor T2 having a high current drivability. Once exceeding the voltage level of VCC–VTN, only the output terminal SAIN with small wiring capacitances should be charged up to the power-supply voltage VCC and the charging requirement can be completed with the PMOS transistor T1 that is small in size.

By way of the configuration in which the current drivability is ensured with the NMOS transistor T2, while the PMOS transistor T2 has a function of adjusting the voltage level to the power-supply voltage VCC, a compact component structure can be made.

In one example of prior art where the precharging transistor structure consists only of a PMOS transistor (Background Art A in FIG. 2), to ensure precharging for the same precharge period Pre as in the present embodiment, the PMOS transistor must be significantly greater because of limitation of its current drivability. By comparison, in the present embodiment, the precharging component can be configured with a compact transistor structure.

In the other example of prior art where the precharging transistor structure consists only of an NMOS transistor (Background Art B in FIG. 2), to ensure precharging for the same precharge period Pre as in the present embodiment, the charging is limited to the voltage level of VCC–VTN. In the present embodiment, the PMOS transistor connected in parallel with the NMOS transistor to control the initialization enables the charging up to the power-supply voltage VCC.

Then, transition from the precharge period Pre to the amplification period Sens takes place upon transitions of the precharge signal EQX for the PMOS transistor T1 to the high level and the precharge signal EQZ for the NMOS transistor T2 to the low level, making the PMOS transistor T1 and the NMOS transistor T2 non-conductive at virtually the same time. Here, the wording "virtually the same time" has the same meaning as above, that is it means a same time involving a time difference by a delay for the logical inversion circuit or the like to generate, from one signal, the other signal with the phase inverted.

In general, switching control of a MOS transistor is performed by making a transition of the voltage level applied to the gate terminal and this voltage transition leads to capacitance coupling through gate-source and gate-drain parasitic capacitances that the transistor has, which affects the voltage level of the source terminal and/or the drain terminal. The effect of the voltage transition on the source terminal and the drain terminal becomes greater when the source and drain terminals have smaller capacitances.

In particular, a problem occurs in the current-voltage conversion operation after the completion of the precharge operation: that is, these parasitic capacitances of the precharging circuit connected to the output terminal SAIN cause a delay in potential change of the internal node in response to the current input to the differential amplification circuit 5 (FIG. 1) as the data from the memory (the output terminal SAIN must be highly sensitive to change in a small current from a memory cell for current-voltage conversion, wherein the ratio of the capacitance of the cell to the total capacitance of the data line, bit lines, etc. is very small), which might result in deterioration in the speed or sensitivity of current sensing.

When the PMOS transistor T1 and the NMOS transistor T2 become non-conductive at virtually the same time, the precharge signal EQX and EQZ level transitions cause capacitance coupling through the parasitic capacitances of these transistors to the output terminal SAIN with a small capacitance.

In the prior art example (Background Art A), the precharging circuit is formed only of the PMOS transistor to which the precharge signal EQX is applied for conduction control, the capacitance coupling resulting from the transition to the high level when making the transistor non-conductive might give rise to a positive voltage fluctuation at the output terminal SAIN (in FIG. 2, (1), A1). In the other prior art example (Background Art B), the precharging circuit is formed only of the NMOS transistor to which the precharge signal EQZ is applied for conduction control, the capacitance coupling resulting from the transition to the low level when making the transistor non-conductive might give rise to a negative voltage fluctuation at the output terminal SAIN (in FIG. 2, (2), A2). When each transistor is made larger to meet requirements of ensuring the current drivability and the like, these voltage fluctuations induced by the capacitance coupling will be still greater.

In contrast, by the control with regard to the present embodiment shown in FIG. 2, the PMOS transistor T1 and the NMOS transistor T2 connected in parallel are controlled to be conductive/non-conductive at virtually the same time. Because the respective precharge signals EQX and EQZ are of opposite phases, the capacitance couplings occurring on the signal level transitions offset each other and the voltage fluctuation at the output terminal SAIN is suppressed to a negligible level.

At the start of the amplification period Sens, the precharged voltage level of the output terminal SAIN does not fluctuate. Subsequent amplification operation of the differential amplification circuit 5 (FIG. 1), subject to change in the voltage level of the output terminal SAIN, which may or may not occur, depending on whether or not data current Idata is present, can begin at readable timing T0 that is earliest from the start of the amplification period Sens.

Here, the readable timing T0 indicates timing when the voltage level of the output terminal SAIN, which begins to fall from the precharged voltage level with the start of the amplification period Sens, when data current Idata flows, becomes below the reference voltage Vref of the differential amplification circuit 5. After the timing T0, the differential amplification circuit 5 performs an amplification operation and can output data from the memory as data OUT.

The present embodiment can avoid the disadvantageous situations exemplified below: as the waveform chart for Background Art A indicates, the positive voltage fluctuation of the precharged voltage level of the output terminal SAIN prolongs a readable timing T1; as the waveform chart for Background Art B indicates, the negative voltage fluctuation of the precharged voltage level of the output terminal SAIN to the extent that the voltage drops below the reference voltage Vref causes a read error.

Figure 3:
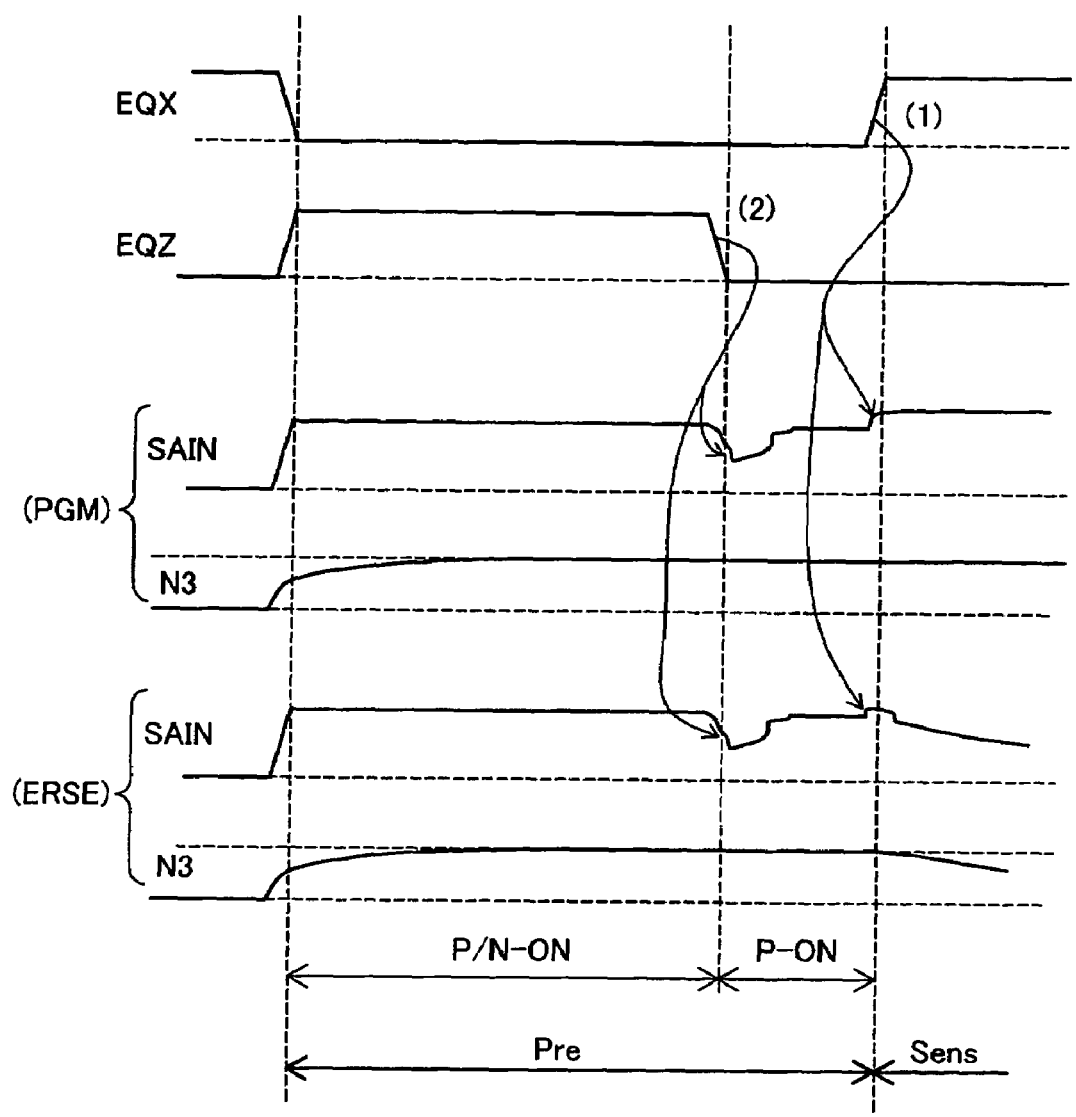
FIG. 3 shows operating waveform charts to explain a second control method in the embodiment of FIG. 1.
Figure 4:
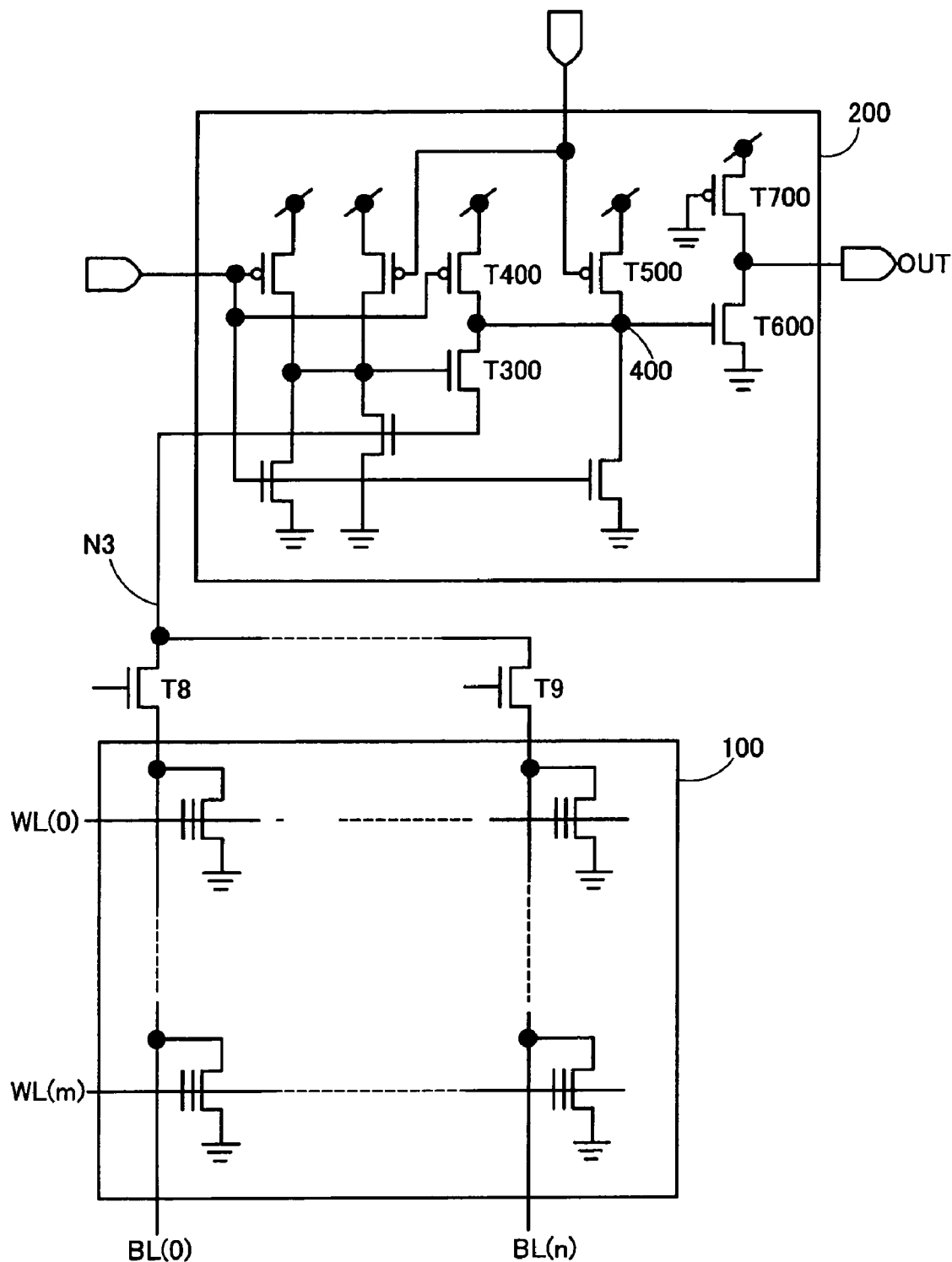
FIG. 4 is a circuit diagram representing of a prior art current sense amplifier circuit.

FIG. 3 relates to a second control method for converting data current Idata read from the semiconductor memory section 100 to a voltage value and amplifying the voltage by the differential amplification circuit 5 (FIG. 1).

Reading of stored information comprises an amplification period Sens of amplifying a voltage to which a data current from the memory was converted and the precharge period Pre that precedes the amplification period Sens. In the second control method, in the precharge period Pre, the NMOS transistor T2 is made non-conductive before the PMOS transistor T1 is made non-conductive. In FIG. 3, a period when both the PMOS transistor T1 and the NMOS transistor T2 are conductive is marked as a P/N-ON period and a period when the PMOS transistor T1 is conductive after the NMOS transistor T2 becomes non-conductive is marked as a P-ON period.

As described for FIG. 2, by making the PMOS transistor T1 and the NMOS transistor T2 non-conductive at virtually the same time, the capacitance couplings resulting from the voltage transitions of the precharge signals EQX and EQZ offset each other and the voltage fluctuation is suppressed. However, it can be supposed that the PMOS transistor T1 and the NMOS transistor T2 are made in different sizes and structures and have different parasitic capacitances between each transistor and the output terminal SAIN. In this case, parts of the capacitance couplings offset each other, but some capacitance coupling may remain, causing the precharged voltage level of the output terminal SAIN to fluctuate.

The second control method illustrated in FIG. 3 is intended to eliminate the remaining voltage fluctuation at the output terminal SAIN due to different parasitic capacitances of the transistors.

As described above, the precharged voltage level of the common data line N3 and the bit lines having great wiring capacitances is sufficiently lower than the voltage level VCC−VTN and these lines are charged via the NMOS transistor T3. Here, in general, the voltage difference between the voltage level of VCC−VTN and the precharged voltage level of the common data line N3, the bit lines, etc. is more than the width of the negative voltage fluctuation at the output terminal SAIN upon the transition of the precharge signal EQZ to the low level, when making the NMOS transistor T2 non-conductive. Therefore, the capacitance coupling resulting from the precharge signal EQZ transition to the low level solely causes the voltage level of the output terminal SAIN to fluctuate, but does not affect the voltage level of the common data line N3 (FIG. 3, (2)).

The voltage fluctuation at the output terminal SAIN can be supposed to be large, taking account of the small capacitance of the output terminal SAIN. However, the voltage fluctuation in that event, can be compensated by charging the terminal through the PMOS transistor T1 during the subsequent P-ON period. Because of the small capacitance of the output terminal SAIN, even when the PMOS transistor T1 is small, the output terminal SAIN can be charged up to the precharged voltage level equaling the power-supply voltage VCC during the predetermined P-ON period. Moreover, the P-ON period can be shortened according to the current drivability of the PMOS transistor T1.

At the end of the P-ON period, the transition of the precharge signal EQX to the high level takes place to make the PMOS transistor T1 non-conductive. However, because the PMOS transistor T1 can be made in a small structure, a positive voltage fluctuation resulting from the capacitance coupling can be reduced to a small range of voltage.

Here, in the circuit configuration of the present embodiment (FIG. 1), when data is read from a memory cell, whose binary state depends on whether or not data current Idata is present, the data current Idata flows toward discharging charges stored as the wiring capacitance on the output terminal SAIN. The sequence of reading stored information is controlled as follows: during the amplification period Sens following the precharge period Pre up to the power-supply voltage VCC, when there is no flow of data current Idata, the output terminal SAIN is maintained at the precharged voltage level; when there is a flow of data current Idata, the voltage of the output terminal SAIN is stepped down gradually from the precharged voltage level by differential amplification by the differential amplification circuit 5.

Specifically, upon a positive voltage fluctuation, when data current Idata flows, a voltage drop starts from a voltage higher than the power-supply voltage VCC and a data read can be performed normally at a readable timing T1 (FIG. 2), though requiring a time longer than at the earliest readable timing T0 (FIG. 2). In contrast, a negative voltage fluctuation to the extent the output terminal SAIN voltage level drops below the reference voltage Vref disables a data read operation when there is no data current Idata flow. In short, this causes a data read error.

Therefore, according to the second control method illustrated in FIG. 3, a negative voltage fluctuation at the output terminal SAIN can be recovered and data from the memory can be read without worry of a data read error.

As detailed hereinbefore, according to the present embodiment, by provision of the NMOS transistor T2 with a high current drivability as a transistor for precharging the output terminal SAIN, that is the conversion node to convert data current Idata to a voltage value, the output terminal SAIN can be quickly energized to approximate the power-supply voltage VCC and gate-source parasitic capacitances attached to the output terminal SAIN can be reduced. The transistor for precharge operation can be made compact and the speed or sensitivity of sensing data current Idata as an input current to the current-voltage conversion circuit 1 can be enhanced.

In addition to the NMOS transistor T2, the PMOS transistor T1 is connected in parallel with it in the configuration, so that the voltage of the output terminal SAIN can be precharged up to the power-supply voltage VCC, which would be limited to the level of the power-supply voltage VCC less the threshold voltage VTN, when charged only by the NMOS transistor T2. Besides, to make the transistors non-conductive when the precharge operation finishes, the precharge signal EQX for the PMOS transistor T1 is toggled from a low voltage level to a high voltage level and the precharge signal EQZ for the NMOS transistor T2 is toggled from a high voltage level to a low voltage level. Since the transitions of the precharge signals EQX and EQZ for these transistors are in opposite directions, the capacitance coupling actions through parasitic capacitances, causing the voltage level of the output terminal SAIN, offset each other. Also, the effect of the capacitance coupling when the NMOS transistor T2 becomes non-conductive can be absorbed by making the PMOS transistor T1 conductive. Because the precharged voltage can be the power-supply voltage VCC, not the power-supply voltage VCC less the threshold voltage VTN, operating margins can be ensured in a wide operating voltage range, even when extensive application of a low power-supply voltage evolves, and conversion errors when the transistors for precharge operation become non-conductive can be prevented.

By parallel arrangement of the PMOS transistor T1 and the NMOS transistor T2 to precharge the output terminal SAIN to the power-supply voltage VCC in the current-voltage conversion circuit 1, their disadvantages which are recognized when either conductive transistor is used singly offset each other and an ideal current-voltage conversion circuit can be realized that improves the speed and sensitivity of current sensing, while carrying out fast precharging with the compact circuitry. In addition, sufficient operating margins can be assured, even with a low power-supply voltage.

It is needless to say that the present invention is not limited to the foregoing embodiment and can be improved and modified in various forms without departing from the sprit of the invention.

For instance, although the present embodiment taking the configuration wherein the differential amplification circuit 5 is provided, following the current-voltage conversion circuit 1, as an example, was discussed, the present invention is not so limited and can be applied in a similar way to the circuitry of the current sense amplifier circuit 200 disclosed, according to the background art. Generally, this invention can be applied to circuitry that, after precharging a current-voltage conversion node to a high voltage level, converts a current value to a voltage value by discharging charges from the conversion node charged to the precharged voltage level, subject to whether or not an input current is present.

Moreover, the current-voltage conversion circuit 1 and differential amplification circuit 5 shown in FIG. 1 can be configured to the bit lines BL (0) to BL (n).

Moreover, the power-supply voltage VCC may be either an external power-supply voltage itself or an internal power-supply voltage using a well-known power supply step-down technology.

Furthermore, while the present embodiment employing the PMOS transistor and the NMOS transistor was discussed as an example, the present invention is not limited to MOS transistors and can be applied in a similar way to other types of transistors, e.g., MIM (Metal/Insulator/Metal) type and MIS (Metal/Insulator/Semiconductor) type transistors formed on a semiconductor substrate. Any of transistor structures of vertical, trench, and multilayer types may also be employed.

Thus it can be seen that an object of the present invention which has been made in view of the above-described problem is to provide a conversion node in which the voltage is initialized with a power-supply voltage and stepped down in proportion to a level of the input current; an N-type transistor that is connected between the conversion node and a power-supply voltage node and turned conductive upon initialization operation of the conversion node; and a P-type transistor that is connected between the conversion node and the power-supply voltage node and turned conductive upon initialization operation of the conversion node.

In the above current-voltage conversion circuit, the conversion node is initialized to the power-supply voltage prior to a current-voltage conversion process in which a step-down from the power-supply voltage takes place by a voltage drop corresponding to the input current. The initialization operation is performed by making the N-type transistor and the P-type transistor conductive, these transistors being coupled between the conversion node and the power-supply voltage node.

Through this arrangement, when both transistors have the same drivability whereby the current drivability difference is based on carrier mobility difference, the N-type transistor is made more compact with a shorter channel width than the P-type transistor. When both transistors have the same size, the N-type transistor can have a greater drivability than the P-type transistor.

Thus, by provision of the N-type transistor as a transistor for the initialization operation, the conversion node can be quickly energized to approximate the power-supply voltage and parasitic capacitances attached to the conversion node, which parasitize the transistor structure, can be reduced. Thereby, the transistor for the initialization operation can be made compact and the speed or sensitivity of input current sensing can be enhanced.

The P-type transistor is connected in parallel with the N-type transistor in the configuration so that the voltage of the conversion node can be initialized up to the power-supply voltage, avoiding limiting the voltage of the conversion node to the level of the power-supply voltage less the threshold voltage which occurs when initialized only by the N-type transistor. In addition to making the transistors non-conductive when the initialization operation finishes, the gate voltage of the N-type transistor is changed from a high voltage level to a low voltage level and the gate voltage of the P-type transistor is changed from a low voltage level to a high voltage level. Because the transitions of the gate voltages of these transistors are in opposite directions, the capacitance coupling actions, through parasitic capacitances, cause the voltage level of the conversion node to fluctuate, offsetting each other. Moreover, the effect of the capacitance coupling when the N-type transistor becomes non-conductive can be absorbed by making the P-type transistor conductive. Because the initialized voltage can be the power-supply voltage, not the power-supply voltage less the threshold voltage, operating margins can be ensured in a wide operating voltage range, even when extensive application of a low power-supply voltage evolves, and conversion errors when the transistors become non-conductive during the initialization operation can be prevented.

By parallel arrangement of the N-type transistor and the P-type transistor to initialize the conversion node to the power-supply voltage in the current-voltage conversion circuit, their disadvantages, which are recognized when either conductive transistor is used singly, offset each other and an ideal current-voltage conversion circuit 1 (FIG. 1) can be realized that enhances the speed and sensitivity of current sensing, while carrying out a fast initialization operation with the compact circuitry. In addition, circuit 1 can ensure sufficient operating margins even with a low power-supply voltage.

The above current-voltage conversion circuit is further characterized by being equipped with an input section that receives an input current and initializes loads on the input current path concurrently with the conversion node initialization operation to regulate the voltage level to a lower voltage than the power-supply voltage through the conversion node.

The input section is an input interface of the current-voltage conversion circuit and it takes an input current and initializes the loads on the input current path with the conducting N-type transistor and P-type transistor during the conversion node initialization operation. At this time, it regulates the initialized voltage level of the loads to a voltage level lower than the voltage level (desirably, the power-supply voltage level) of the conversion node.

With this, when the loads on the input current path are initialized concurrently with the conversion node initialization, the initialized voltage level of the loads on the input current path can be set at a lower voltage than the power-supply voltage by making the N-type transistor and the P-type transistor conductive. Even when the loads on the input current path are great, they can be initialized with the N-type transistor having a high current drivability and a fast load initialization operation can be carried out.

Particularly, in an instance where the initialized voltage level of the loads is below the voltage level of the power-supply voltage less the threshold voltage, the loads can be initialized to the intended voltage level with the N-type transistor and the initialization operation can be completed quickly by the N-type transistor having a high current drivability.

The above current-voltage conversion circuit is further characterized in that the N-type transistor makes the voltage level of the conversion node close to the power-supply voltage in the early stage of the initialization operation and the P-type transistor adjusts the voltage level of the conversion node to the power-supply voltage in the later stage of the initialization operation. Here, it is preferable that the current drivability of the N-type transistor is greater than that of the P-type transistor.

With this, an ideal initialization operation can be performed by utilizing the advantages of both transistors: that is, the high current drivability of the N-type transistor and the P-type transistor capable of initializing the voltage level up to the power-supply voltage. Due to their carrier mobility difference, an N-type transistor that is made more compact than a P-type transistor implementation can have a greater drivability than the P-type transistor. The current-voltage conversion circuit can be configured to perform a fast initialization operation while limiting parasitic capacitances attached to the conversion node to a small capacitance value.

The above current-voltage conversion circuit is further characterized in that the P-type transistor remains conductive after the N-type transistor is made non-conductive. Therefore, even if, when the N-type transistor becomes non-conductive, a transition of the gate voltage to a low voltage level causes a voltage drop in the voltage level of the conversion node through the parasitic capacitances, the conversion node is allowed to recover to the power-supply voltage level through the P-type transistor.

A non-volatile semiconductor memory device of the present invention, from which information stored in a selected memory cell is read as the presence or the absence of a data current, is characterized by including a conversion node which is initialized to a power-supply voltage and converts the data current to a voltage stepped down from the power-supply voltage by a voltage drop corresponding to the data current; an N-type transistor and a P-type transistor which are connected between the conversion node and the power-supply voltage node and made conductive during the conversion node initialization operation; a data line which is initialized to a voltage lower than the power-supply voltage and through which the data current flows; and an input section which connects the conversion node and the data line, transmits the data current to the conversion node, and initializes the data line concurrently with the conversion node initialization operation to regulate the voltage level of the conversion node to a voltage lower than the power-supply voltage.

In the above non-volatile semiconductor memory device, stored information read from the selected memory cell is transmitted as the data current through the data line, the input section, and then the conversion node. The conversion node performs current-voltage conversion in which a step-down from the power-supply voltage takes place by a voltage drop corresponding to the input current and, prior to that, the conversion node is initialized to the power-supply voltage. The initialization operation is performed by making the N-type transistor and the P-type transistor conductive, these transistors being connected between the conversion node and the power-supply voltage node. At this time, the input section initializes the data line by exerting the conducting action and effect of the N-type transistor and the P-type transistor which initialized the conversion node on the data line as well, while regulating the initialized voltage level to a voltage level lower than the voltage level of the conversion node.

Thereby, during the conversion node initialization operation prior to the conversion of the data current read from the memory cell through the data line to a voltage value, the conversion node can be quickly energized to approximate the power-supply voltage with the N-type transistor having a higher current drivability than the P-type transistor. Because the N-type transistor has such a high drivability, it can be made compact, while ensuring a sufficient current drivability, and parasitic capacitances attached to the conversion node can be reduced. In response to high integration and high speed requirements of non-volatile semiconductor memory devices, fast initialization operations and enhancing the speed or sensitivity of current sensing can be achieved, without significantly increasing the area occupied by the transistors for the initialization operation.

In addition to the N-type transistor, the P-type transistor is connected in parallel with it as another transistor for initialization and, consequently, the conversion node can be initialized up to the power-supply voltage by using the P-type transistor for a voltage range higher than the level of the power-supply voltage less the threshold voltage, a voltage range not achievable by the N-type transistor. In addition, to make the transistors non-conductive when the initialization operation finishes, the gate voltage of the N-type transistor is changed from a high voltage level to a low voltage level and the gate voltage of the P-type transistor is changed from a low voltage level to a high voltage level. Because the transitions of the gate voltages of these transistors are in opposite directions, the capacitance coupling actions through parasitic capacitances, causing the voltage level of the conversion node to fluctuate, offset each other. Moreover, the effect of the capacitance coupling when the N-type transistor becomes non-conductive can be absorbed by making the P-type transistor conductive. In response to low power-supply voltage requirements of non-volatile semiconductor memory devices, a voltage value to which conversion is made can be set in a wider voltage range, wide operating margins can be ensured, and read errors of data from the non-volatile semiconductor memory device can be prevented.

In the non-volatile semiconductor memory device, by parallel arrangement of the N-type transistor and the P-type transistor to initialize the conversion node to the power-supply voltage, when reading information stored in a memory cell as data current, their separate disadvantages which are recognized when either conductive transistor is used singly offset each other, thereby enhancing the speed and sensitivity of current sensing, while carrying out fast initialization operations with the compact circuitry. Also, the present invention can ensure sufficient operating margins even with a low power-supply voltage, which greatly contributes to meeting requirements of high integration, high speed, low power-supply voltage, etc. for non-volatile semiconductor memory devices.

When initializing the data line via the input section is performed concurrently with the conversion node initialization, the data line for which the initialized voltage level is lower than the power-supply voltage is initialized by the conducting N-type transistor. Even in a situation where the data line is quite long, a great number of memory cells and the like are connected to it, and loads such as wiring capacitances and parasitic capacitances attached to the data line are great, the initialization of such data lines can be performed with the N-type transistor having a high current drivability thereby permitting fast data line initialization operations to be carried out.

Particularly, in an instance where the initialized voltage level of the data line is required to be strictly lower than the power-supply voltage in consideration of a disturbance phenomenon in memory cells of a flash memory or the like, initializing the data line to the intended voltage level can be performed mainly with the N-type transistor and the initialization operation can be completed quickly by the N-type transistor having a high current drivability.

The above non-volatile semiconductor memory device is further characterized in that the N-type transistor makes the voltage level of the conversion node close to the power-supply voltage in the early stage of the initialization operation and the P-type transistor adjusts the voltage level of the conversion node to the power-supply voltage in the later stage of the initialization operation. Here, it is preferable that the current drivability of the N-type transistor is greater than that of the P-type transistor.

Thereby, ideal initialization operations can be performed by utilizing the advantages of both transistors: that is, the high current drivability of the N-type transistor and the P-type transistor capable of initializing the voltage level up to the power-supply voltage. Due to their carrier mobility difference, an N-type transistor that is made more compact than the P-type transistor implementation can still have a greater drivability than the P-type transistor. The non-volatile semiconductor memory device can be configured to perform fast initialization operations, while limiting parasitic capacitances attached to the conversion node to a small capacitance value.

The above non-volatile semiconductor memory device is further characterized in that the P-type transistor remains conductive after the N-type transistor is made non-conductive. Therefore, even when the N-type transistor becomes non-conductive, and a transition of the gate voltage to a low voltage level causes a voltage drop in the voltage level of the conversion node through the parasitic capacitances, the conversion node is allowed to recover to the power-supply voltage level through the P-type transistor.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims.

INDUSTRIAL APPLICABILITY

As is obvious from the foregoing description, according to the present invention, it is possible to provide a current-voltage conversion circuit, a non-volatile semiconductor memory device, and a current-voltage conversion method that can achieve both enhancing the speed and sensitivity of current sensing and precharging at a higher speed together in compact circuitry, while preventing a conversion error in the process of current-voltage conversion, and that can function well with a low power-supply voltage.

What is claimed is:

1. A current-voltage converter circuit through which voltage is stepped down in proportion to a level of an input current from a power-supply voltage, said voltage being outputted therefrom, the current-voltage converter circuit comprising:
- a conversion node at which said voltage is initialized with a power-supply voltage and stepped down in proportion to a level of the input current;
- an N-type transistor that is connected between the conversion node and a power-supply voltage node and turned conductive in response to an initialization operation at the conversion node; and
- a P-type transistor that is connected between the conversion node and the power-supply voltage node and turned conductive in response to an initialization operation at the conversion node.

2. A current-voltage converter circuit according to claim 1 further comprising an input section that receives the input current and converts a voltage level at the conversion node to lower said voltage in accordance with the power-supply voltage so as to initialize a load on the input current concurrently with the initialization operation at the conversion node.

3. A current-voltage converter circuit according to claim 1, wherein
- the N-type transistor lowers the voltage level at the conversion node substantially to a level of the power-supply voltage during an initial stage of the initialization operation, and
- wherein the P-type transistor adjusts the voltage level at the conversion node to the level of the power-supply voltage during a final stage of the initialization operation.

4. A current-voltage converter circuit according to claim 3, wherein a current drivability of the N-type transistor is higher than a current drivability of the P-type transistor.

5. A current-voltage converter circuit according to claim 3, wherein the P-type transistor remains conductive after the N-type transistor becomes non-conductive.

6. A current-voltage converter circuit according to claim 2, wherein
- the N-type transistor lowers the voltage level at the conversion node substantially to a level of the power-supply voltage during an initial stage of the initialization operation, and
- wherein the P-type transistor adjusts the voltage level at the conversion node to the level of the power-supply voltage during a final stage of the initialization operation.

7. A current-voltage converter circuit according to claim 6, wherein a current drivability of the N-type transistor is higher than a currently drivability of the P-type transistor.

8. A current-voltage converter circuit according to claim 6, wherein the P-type transistor remains conductive after the N-type transistor becomes non-conductive.

9. A non-volatile semiconductor memory device from which memory information stored in a selected memory cell is read out as a present/absence of an information current, the non-volatile semiconductor memory device comprising:
- a conversion node at which a voltage is initialized with a power-supply voltage and stepped down to a voltage level in proportion to a level of the information current;
- an N-type transistor that is connected between the conversion node and a power-supply voltage node and turned conductive in response to an initialization operation at the conversion node;
- a P-type transistor that is connected between the conversion node and the power-supply voltage node and turned conductive in response to an initialization operation at the conversion node;
- a data line initialized to a voltage level which is lower than the power-supply voltage, wherein the information current flows through the data line; and
- an input section connected to the conversion node and the data line to provide the information current to the conversion node, the input section converting the voltage level at the conversion node to lower said voltage level in accordance with the power-supply voltage so as to initialize the data line concurrently with the initialization operation at the conversion node.

10. A non-volatile semiconductor memory device according to claim 9, wherein the N-type transistor lowers the voltage level at the conversion node substantially to a level of the power-supply voltage during an initial stage of the initialization operation, and
- wherein the P-type transistor adjusts the voltage level at the conversion node to the level of the power-supply voltage during a final stage of the initialization operation.

11. A non-volatile semiconductor memory device according to claim 9, wherein a current drivability of the N-type transistor is higher than a current drivability of the P-type transistor.

12. A non-volatile semiconductor memory device according to claim 9, wherein the P-type transistor remains conductive after the N-type transistor becomes non-conductive.

* * * * *